(12) United States Patent
Saito et al.

(10) Patent No.: US 10,389,295 B2
(45) Date of Patent: Aug. 20, 2019

(54) ENCLOSURE FOR CONCENTRATOR PHOTOVOLTAIC DEVICE AND CONCENTRATOR PHOTOVOLTAIC DEVICE USING SAME

(71) Applicant: Sumitomo Electric Industries, Ltd., Osaka-shi (JP)

(72) Inventors: Kenji Saito, Osaka (JP); Takashi Iwasaki, Osaka (JP); Youichi Nagai, Osaka (JP); Yoshiya Abiko, Osaka (JP); Akihiko Kojima, Osaka (JP); Makoto Inagaki, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/743,962

(22) PCT Filed: Sep. 30, 2016

(86) PCT No.: PCT/JP2016/079086
§ 371 (c)(1),
(2) Date: Jan. 11, 2018

(87) PCT Pub. No.: WO2017/061335
PCT Pub. Date: Apr. 13, 2017

(65) Prior Publication Data
US 2018/0212557 A1   Jul. 26, 2018

(30) Foreign Application Priority Data
Oct. 5, 2015   (JP) .................. 2015-197903

(51) Int. Cl.
*H02S 30/10*   (2014.01)
*H02S 20/32*   (2014.01)
(Continued)

(52) U.S. Cl.
CPC .......... *H02S 30/10* (2014.12); *G02B 19/0014* (2013.01); *G02B 19/0042* (2013.01);
(Continued)

(58) Field of Classification Search
None
See application file for complete search history.

(56) References Cited

U.S. PATENT DOCUMENTS 8,592,738 B1   11/2013   Kozin et al.
2009/0188560 A1   7/2009   Lee et al.
(Continued)

FOREIGN PATENT DOCUMENTS

JP   H07-274742 A   10/1995
JP   2000-156518 A   6/2000
(Continued)

*Primary Examiner* — Eli S Mekhlin
(74) *Attorney, Agent, or Firm* — Baker Botts L.L.P.; Michael A. Sartori

(57) ABSTRACT

An enclosure for a concentrator photovoltaic device according to the present disclosure includes a side wall having an upper end, a lower end, an inner surface, and an outer surface, the side wall being composed of a resin, the side wall being provided with an air hole extending through the inner and outer surfaces of the side wall, the air hole being inclined from the inner surface of the side wall to the outer surface of the side wall in a direction from the upper end of the side wall toward the lower end of the side wall. According to the present disclosure, power generation efficiency of a photovoltaic module can be further increased, and the photovoltaic module can be suppressed from being decreased in performance due to entrance of undesired matters to inside of the case, such as dusts, water droplets, and foreign matters.

10 Claims, 8 Drawing Sheets

(51) Int. Cl.
 *H02S 40/22* (2014.01)
 *G02B 19/00* (2006.01)
 *H01L 31/052* (2014.01)
 *H01L 31/054* (2014.01)
 *H02S 40/42* (2014.01)
 *G02B 3/08* (2006.01)

(52) U.S. Cl.
 CPC ........ *H01L 31/052* (2013.01); *H01L 31/0543* (2014.12); *H02S 20/32* (2014.12); *H02S 40/22* (2014.12); *H02S 40/42* (2014.12); *G02B 3/08* (2013.01); *Y02E 10/52* (2013.01)

(56) References Cited

U.S. PATENT DOCUMENTS

| | | | |
|---|---|---|---|
| 2009/0260674 A1 | 10/2009 | Linke | |
| 2010/0037935 A1* | 2/2010 | Vaid | H01L 31/02168 136/246 |
| 2011/0067747 A1* | 3/2011 | Chen | H01L 31/052 136/246 |
| 2011/0263067 A1* | 10/2011 | Vaid | H01L 31/052 438/65 |
| 2012/0204925 A1* | 8/2012 | Lyden | H01L 31/042 136/244 |
| 2012/0325289 A1 | 12/2012 | Deck | |
| 2015/0085225 A1* | 3/2015 | Lee | G02B 19/0066 349/69 |

FOREIGN PATENT DOCUMENTS

| | | | |
|---|---|---|---|
| JP | 2000-220227 A | | 8/2000 |
| JP | 2000220227 A | * | 8/2000 |
| JP | 2002-289897 A | | 10/2002 |
| JP | 2005-233313 A | | 9/2005 |
| JP | 2006-343435 A | | 12/2006 |
| JP | 2008-004661 A | | 1/2008 |
| JP | 2008-084955 A | | 4/2008 |
| WO | 2013/150031 A1 | | 10/2013 |

* cited by examiner

ENCLOSURE FOR CONCENTRATOR PHOTOVOLTAIC DEVICE AND CONCENTRATOR PHOTOVOLTAIC DEVICE USING SAME

TECHNICAL FIELD

The present invention relates to an enclosure for a photovoltaic device, particularly, a photovoltaic module in which a power generation element provided in the enclosure receives sunlight and generates electric power depending on an amount of the received light.

The present application claims a priority based on Japanese Patent Application No. 2015-197903 filed on Oct. 5, 2015, the entire content of which is incorporated herein by reference.

BACKGROUND ART

Conventionally, a photovoltaic module for collecting sunlight and converting it into electric power has been developed. For example, the following art is disclosed in Patent Document 1 (WO 2013/150031). That is, a concentrator photovoltaic device described in Patent Document 1 includes a lens and a power generation element in its case, wherein a distance between the lens and the power generation element is adjusted by introducing gas into the case.

Moreover, for example, the following art is disclosed in Patent Document 2 (U.S. Pat. No. 8,592,738).

That is, a device for checking the optical axis of incoming light is attached to a concentrator photovoltaic device described in Patent Document 2.

Next, for example, the following art is disclosed in Patent Document 3 (Japanese Patent Laying-Open No. 2008-84955). That is, a concentrator photovoltaic unit described in Patent Document 3 includes: a light-transmitting protection plate for protecting the top surface of the concentrator photovoltaic unit, a condensing lens for collecting sunlight being joined to the light-transmitting protection plate; an elongated frame serving as a base structure for the concentrator photovoltaic unit; and a solar cell mounted plate on which a plurality of solar cells are mounted. Moreover, the elongated frame is provided with an air hole at its end portion in the longitudinal direction to cause flow of air in the elongated frame.

Moreover, for example, the following art is disclosed in Patent Document 4 (Japanese Patent Laying-Open No. 2008-4661). That is, a concentrator photovoltaic device described in Patent Document 4 includes a case that is surrounded by a bottom member, a circumferential member, and an upper member to have a space therein and that is used such that the upper member is inclined to face the sun. The upper member of this case is provided with a plurality of Fresnel lenses for collecting sunlight. A plurality of photovoltaic cells are included in the case in order to receive the light collected by the Fresnel lenses to generate electric power. Moreover, the circumferential member of the case has opposing surfaces each provided with at least two openings. The two openings in each of the surfaces are disposed at the upper side and at the lower side. The upper side is closer to the Fresnel lenses, and the lower side is closer to the photovoltaic cells.

CITATION LIST

Patent Document

PTD 1: WO 2013/150031
PTD 2: U.S. Pat. No. 8,592,738
PTD 3: Japanese Patent Laying-Open No. 2008-84955
PTD 4: Japanese Patent Laying-Open No. 2008-4661
PTD 5: Japanese Patent Laying-Open No. 7-274742

SUMMARY OF INVENTION

An enclosure for a concentrator photovoltaic device according to one embodiment of the present invention includes a side wall having an upper end, a lower end, an inner surface, and an outer surface, the side wall being composed of a resin, the side wall being provided with an air hole extending through the inner and outer surfaces of the side wall, the air hole being inclined from the inner surface of the side wall to the outer surface of the side wall in a direction from the upper end of the side wall toward the lower end of the side wall.

DESCRIPTION OF EMBODIMENTS

Figure 1:
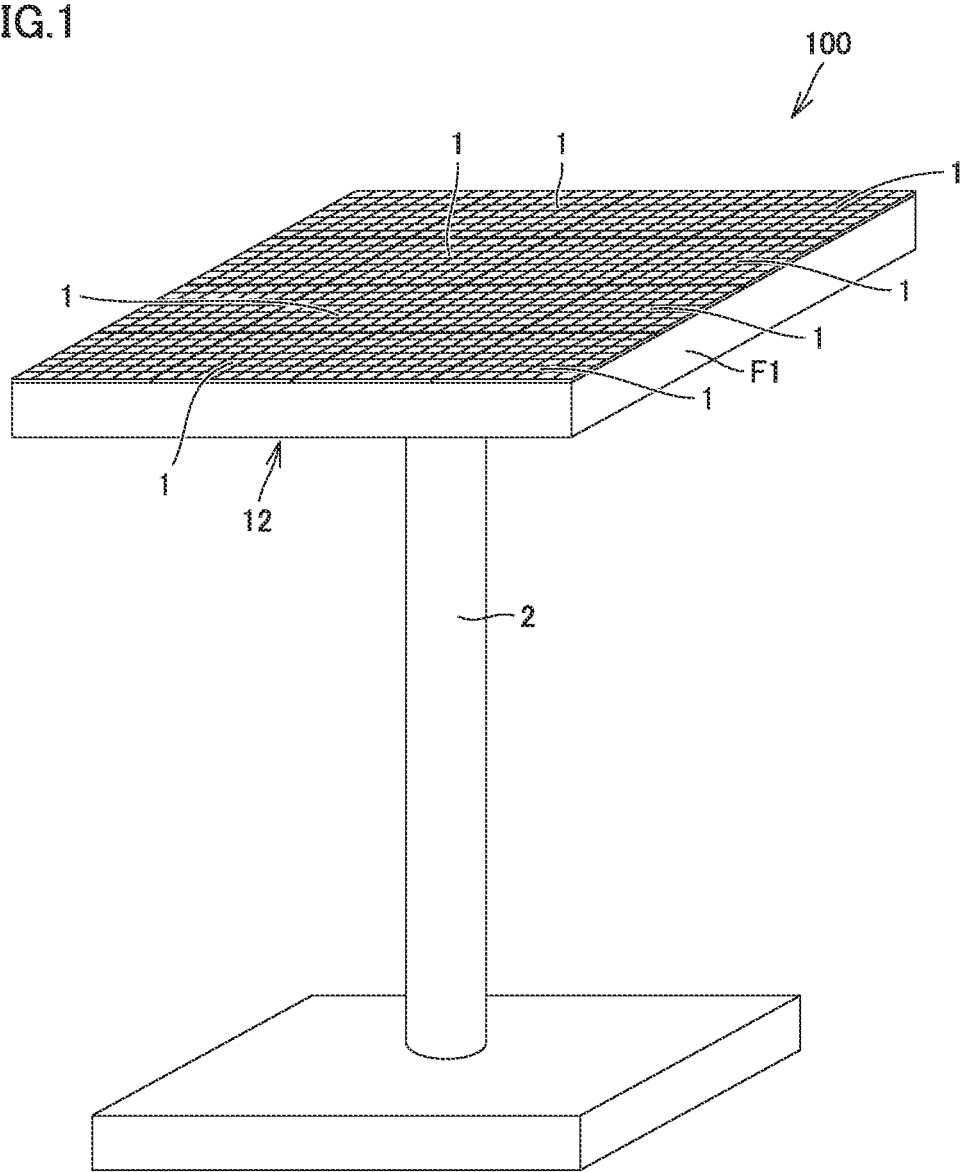
FIG. 1 is a perspective view of a concentrator photovoltaic device using a case according to a first embodiment.

Problem to be Solved by the Present Disclosure

A common and ultimate challenge among the above-described conventional arts is to exhibit power generation efficiency and other performance under a severe outdoor environment; however, sufficient performance cannot be always achieved under such a severe environment.

More specifically, there are the following problems. Since the case is composed of a metal in each of the above-described conventional arts, the bottom portion of the case is expanded or contracted in response to a change in temperature, thereby changing a distance between the power generation element provided at the bottom portion and the Fresnel lens provided at the upper surface of the case. Accordingly, the amount of sunlight collected to the power generation element is decreased significantly to decrease the power generation efficiency of the photovoltaic module, with the result that sufficient power generation efficiency is not obtained.

Meanwhile, for example, the concentrator photovoltaic unit described in Patent Document 3 is provided with an air hole cover for covering the air hole provided in the end portion of the elongated frame in order to prevent foreign matters, such as rain water or dusts, from entering the inside of the elongated frame via the air hole. However, even with such a configuration, the entrance of foreign matters may be unable to be prevented sufficiently, with the result that the performance or the like of the concentrator photovoltaic unit may be decreased due to the entrance of foreign matters.

In view of such problems, the present disclosure provides a configuration capable of further increasing power generation efficiency of a photovoltaic module and suppressing performance thereof from being decreased due to entrance of undesired matters into a case, such as dusts, water droplets, and foreign matters.

Advantageous Effect of the Present Disclosure

According to the present disclosure, there can be provided a configuration capable of further increasing power generation efficiency of a concentrator photovoltaic module and suppressing entrance of undesired matters into the case, such as dusts, water droplets, and foreign matters.

DESCRIPTION OF EMBODIMENTS OF THE PRESENT INVENTION

First, embodiments of the present invention are listed and described.

(1) An enclosure for a concentrator photovoltaic device according to one embodiment of the present invention includes a side wall having an upper end, a lower end, an inner surface, and an outer surface, the side wall being composed of a resin, the side wall being provided with an air hole extending through the inner and outer surfaces of the side wall, the air hole being inclined from the inner surface of the side wall to the outer surface of the side wall in a direction from the upper end of the side wall toward the lower end of the side wall. It should be noted that the case where the air hole is inclined from the inner surface of the side wall to the outer surface of the side wall in the direction from the upper end of the side wall toward the lower end of the side wall encompasses a case where the air hole is formed to extend straightly downward from the inner surface of the side wall to the outer surface of the side wall.

According to such a configuration in which the inclined air hole is provided in the side wall of the enclosure, a temperature in the case becomes close to a temperature outside the case, thereby suppressing excessive temperature increase. Moreover, undesired matters such as dusts, water droplets, and foreign matters can be suppressed from entering the inside of the case. Moreover, the side wall is composed of a resin. Therefore, even if the focal distance of a lens is changed in response to a change in temperature, the side wall is also expanded or contracted in response to the change in temperature, thereby changing the distance between the lens and a power generation element. Hence, even if the focal distance of the lens is changed, the amount of sunlight collected to the power generation element is prevented from being decreased significantly, whereby the power generation efficiency of the photovoltaic module can be suppressed from being decreased.

(2) In the enclosure for the concentrator photovoltaic device according to (1), the side wall may be inclined relative to the outer surface side.

According to such a configuration of the side wall, the inclination of the air hole can be large, whereby undesired matters such as dusts, water droplets, and foreign matters can be further suppressed from entering the inside of the case.

(3) In the enclosure for the concentrator photovoltaic device according to (1), the side wall may have a partition plate inside the air hole, the partition plate being formed to cross the inner surface of the side wall.

According to such a configuration in which the partition plate is provided inside the air hole, undesired matters such as dusts, water droplets, and foreign matters can be further suppressed from entering the inside of the case.

(4) In the enclosure for the concentrator photovoltaic device according to (3), the partition plate may project relative to the inner surface of the side wall.

According to such a configuration in which the partition plate projects relative to the inner surface of the side wall, the width of the side wall can be longer than the length of the air hole, thereby increasing the strength of the side wall.

(5) The enclosure for the concentrator photovoltaic device according to (3) may include a projecting ring formed to surround an outer circumference of the air hole at the inner surface of the side wall.

According to such a configuration in which the projecting ring is provided at the inner surface of the side wall, air passing through the air hole can be guided, thereby further suppressing excessive temperature increase in the case.

(6) In the enclosure for the concentrator photovoltaic device according to (3), the partition plate may be formed to extend in the direction from the upper end of the side wall toward the lower end of the side wall.

According to such a configuration of the partition plate, a straightening action is produced to permit air to efficiently flow upward and downward within the case, thereby further suppressing excessive temperature increase in the case.

(7) In the enclosure for the concentrator photovoltaic device according to (1), the side wall may have a main side plate and a sub-side plate, the main side plate may be formed to be inclined at a first angle relative to the outer surface side of the side wall, and the sub-side plate may be formed to be inclined relative to the outer surface side of the side wall at a second angle larger than the first angle.

According to such a configuration in which the side wall has the main side plate and the sub-side plate, strength and rigidity of the case can be improved.

(8) In the enclosure for the concentrator photovoltaic device according to (7), the air hole may be formed in the sub-side plate.

According to such a configuration in which the air hole is formed in the sub-side plate, the inclination of the air hole can be large, whereby undesired matters such as dusts, water droplets, and foreign matters can be further suppressed from entering the inside of the case.

(9) In the enclosure for the concentrator photovoltaic device according to (7), the sub-side plate may be formed at the outer surface side of the side wall.

According to such a configuration in which the sub-side plate is formed at the outer surface side of the side wall, strength and rigidity of the case can be improved.

(10) In the enclosure for the concentrator photovoltaic device according to (3), the partition plate may be formed to divide the air hole into at least two sub-air holes.

According to such a configuration in which the partition plate is formed to divide the air hole into the plurality of sub-air holes, durability of the air hole can be improved.

(11) In the enclosure for the concentrator photovoltaic device according to (3), the partition plate may be formed such that a whole of the air hole is covered with the partition plate when the enclosure for the concentrator photovoltaic device is viewed in a side view.

According to such a configuration in which the partition plate is formed such that the whole of the air hole is covered with the partition plate when the enclosure for the concentrator photovoltaic device is viewed in a side view, water can be further suppressed from entering the inside of the case even when slanting rain is falling, for example.

(12) In the enclosure for the concentrator photovoltaic device according to (3), the partition plate may include an end portion at the outer surface side of the side wall and an end portion at the inner surface side of the side wall, and the end portion at the outer surface side of the side wall may be formed to be acute.

According to such a configuration in which the end portion of the partition plate at the outer surface side of the side wall is acute, even if water flows on the partition plate, the water is facilitated to fall downward, whereby the water can be further suppressed from entering the inside of the case.

(13) A concentrator photovoltaic device according to one embodiment of the present invention includes the enclosure for the concentrator photovoltaic device as recited in any one of (1) to (12).

According to such a configuration having the enclosure for the concentrator photovoltaic device, a temperature in the case becomes close to a temperature outside the case, thereby suppressing excessive temperature increase. Further, if the focal distance of the lens is changed in response to the change in temperature, the side wall composed of a resin is also expanded or contracted in response to the change in temperature, thereby changing the distance between the lens and the power generation element. Hence, even if the focal distance of the lens is changed, the amount of sunlight collected to the power generation element is prevented from being decreased significantly, whereby the power generation efficiency of the photovoltaic module can be suppressed from being decreased.

DETAILS OF EMBODIMENTS OF THE PRESENT INVENTION

The following describes embodiments of the present invention with reference to figures. It should be noted that the same or corresponding portions in the figures are given the same reference characters. Moreover, at least a part of the embodiments described below may be appropriately combined.

First Embodiment

[Configuration of Photovoltaic Device]

Figure 2:
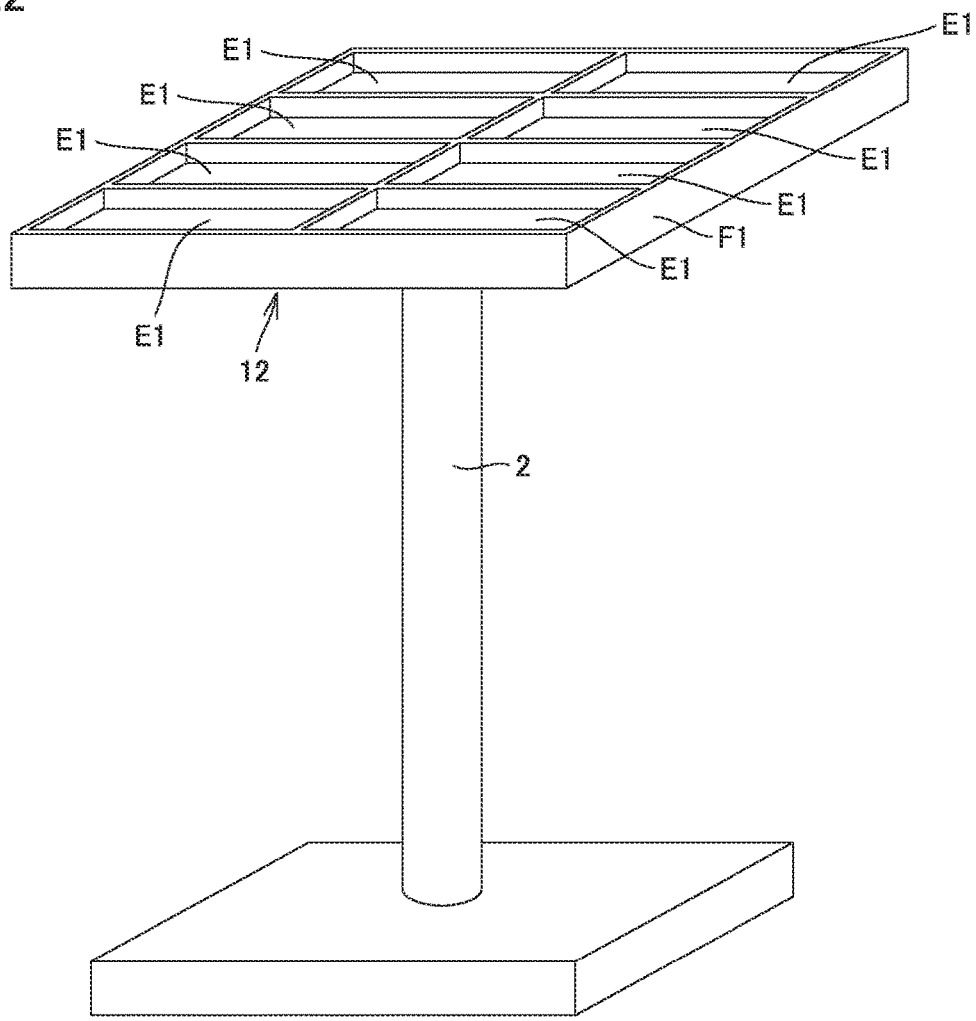
FIG. 2 is a perspective view showing a configuration of a platform shown in FIG. 1.

FIG. 1 is a perspective view of a concentrator photovoltaic device using a case according to a first embodiment. FIG. 2 is a perspective view showing a configuration of a platform shown in FIG. 1.

As shown in FIG. 1, a photovoltaic device 100 includes a plurality of photovoltaic modules 1 and a platform 2. Platform 2 includes a frame member F1, a solar azimuth indicator C1 not shown in the figures, and a driver M1 not shown in the figures. Solar azimuth indicator C1 includes a sensor for detecting a position of the sun. The plurality of photovoltaic modules 1 are fixedly arranged on frame member F1.

Driver M1 recognizes the position of the sun based on a signal output from solar azimuth indicator C1, and changes an orientation of frame member F1 during a period of time from sunrise to sunset such that the respective light receiving surfaces of photovoltaic modules 1 face the sun, for example.

As shown in FIG. 2, in frame member F1 of platform 2, a plurality of columns are provided to cross one another longitudinally and laterally. Into each of rectangular-solid-shaped accommodation portions E1 (each having no upper surface and having a bottom surface) formed by this frame member F1, one photovoltaic module 1 is inserted. It should be noted that each of accommodation portions E1 shown in FIG. 2 has a rectangular solid shape, but may have a cubic shape or the like.

A panel case (entire frame) 12 having the plurality of accommodation portions E1 is in the form of a saucer partitioned into the plurality of sections (accommodation portions) by frame member F1. It should be noted that although each of the photovoltaic modules has a side wall composed of a resin as described below, even such a photovoltaic module exhibits sufficient mechanical strength when attached to panel case 12.

[Configuration of Photovoltaic Module]

Figure 3:
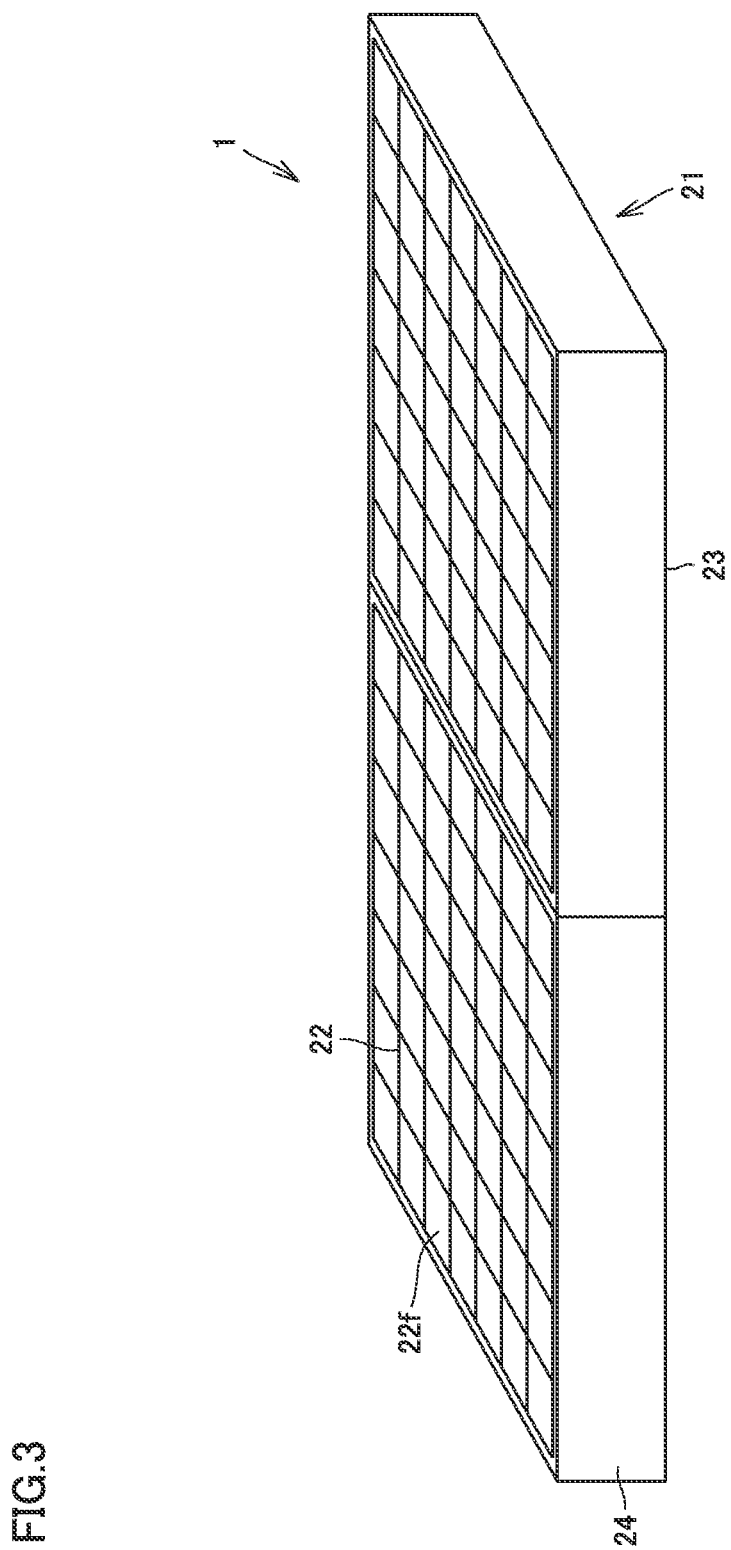
FIG. 3 is a perspective view of a concentrator photovoltaic module using the case according to the first embodiment.
Figure 4:
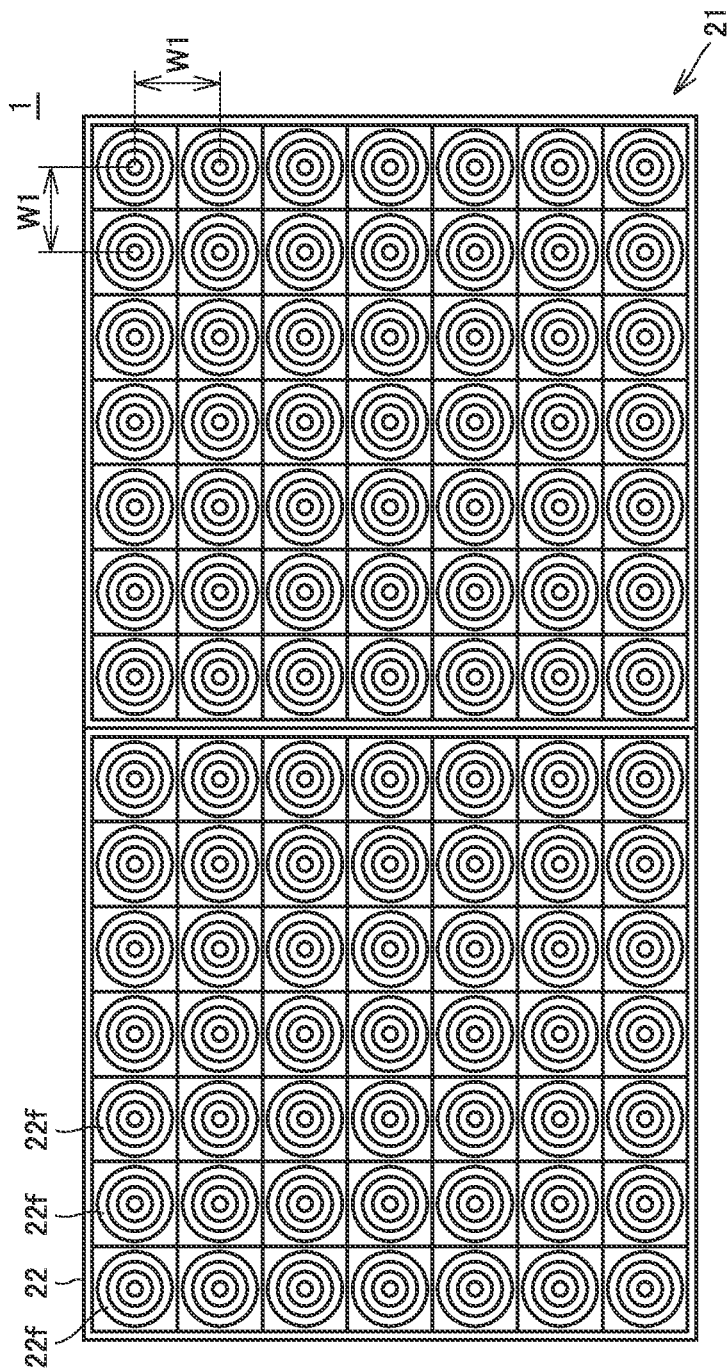
FIG. 4 is a plan view of the concentrator photovoltaic module using the case according to the first embodiment.
Figure 5:
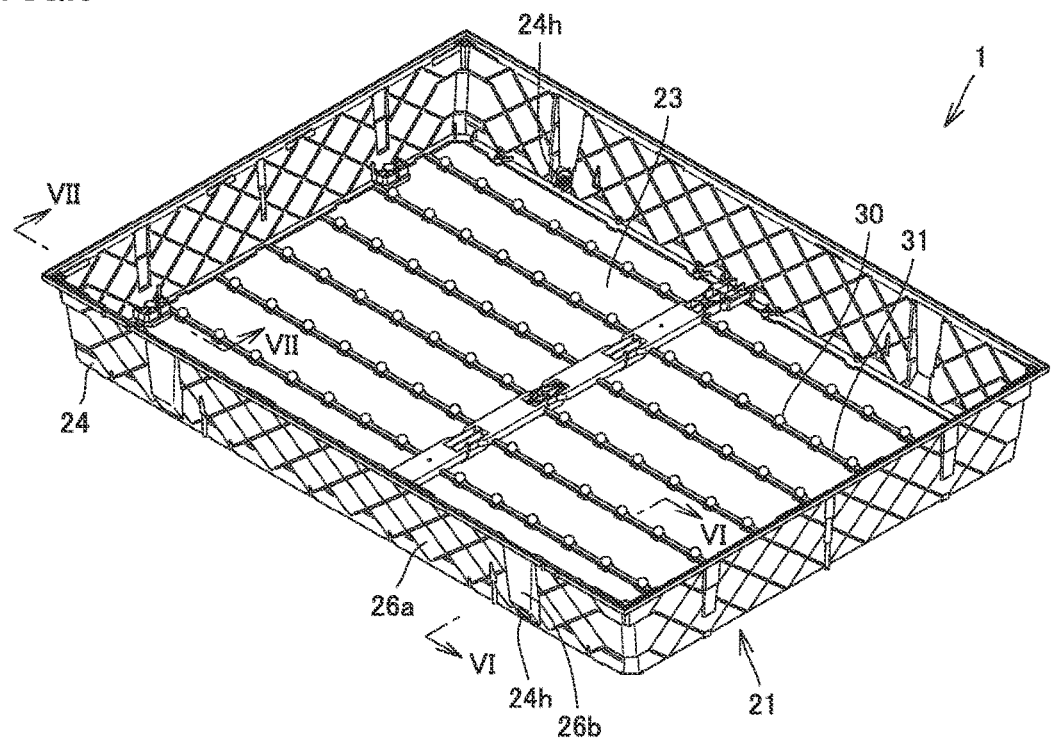
FIG. 5 is a perspective view showing a detailed configuration of the case according to the first embodiment.

FIG. 3 is a perspective view of the concentrator photovoltaic module using the case according to the first embodiment. FIG. 4 is a plan view of the concentrator photovoltaic module using the case according to the first embodiment. FIG. 5 is a perspective view showing a detailed configuration of the case according to the first embodiment. It should be noted that since FIG. 5 illustrates an internal configuration of a case 21, no light collecting portion 22 is shown therein.

As shown in FIG. 3 and FIG. 4, photovoltaic module 1 includes case 21 having a rectangular solid shape or a cubic shape. Case 21 has a bottom portion 23, a side wall 24, and a light collecting portion 22. Side wall 24 corresponds to a side surface of case 21. Light collecting portion 22 is provided at the upper end of side wall 24, and bottom portion 23 is provided at the lower end of side wall 24. That is, light collecting portion 22 corresponds to the upper surface of case 21, and bottom portion 23 corresponds to the bottom surface of case 21.

Bottom portion 23 is composed of aluminum, for example. Side wall 24 is composed of a resin. It should be noted that details of the configuration of side wall 24 will be described later.

Light collecting portion 22 includes a plurality of Fresnel lenses 22f. In light collecting portion 22, Fresnel lenses 22f are disposed in the form of a tetragonal lattice, for example. Specifically, for example, Fresnel lenses 22f are disposed such that a distance between the respective centers of adjacent Fresnel lenses 22f is equally W1 among Fresnel lenses 22f.

As shown in FIG. 5, a plurality of power generation elements 30 and a plurality of FPCs (Flexible Printed Circuits) 31 are further included in case 21 of photovoltaic module 1.

As shown in FIG. 5, the plurality of FPCs 31 are disposed side by side in parallel or substantially in parallel with one another at bottom portion 23. A plurality of power generation elements 30 are mounted on each FPC 31.

Each of power generation elements 30 is provided at a position corresponding to a Fresnel lens 22f, receives sunlight collected by the corresponding Fresnel lens 22f, and generates electric power depending on an amount of the received light.

[Details of Configuration of Side Wall]

As shown in FIG. 5, side wall 24 may be preferably inclined relative to the outer side of case 21, i.e., the outer surface side of the side wall.

Preferably, as shown in FIG. 5, side wall 24 may be constituted of a main side plate 26a and a sub-side plate 26b. Moreover, preferably, as shown in FIG. 5, main side plate 26a may be formed to be inclined at a first angle relative to the outer surface side, and sub-side plate 26b may be formed to be inclined relative to the outer surface side at a second angle larger than the first angle. Further, preferably, as shown in FIG. 5, sub-side plate 26b may be formed at a part of a region on the outer surface of main side plate 26a.

As shown in FIG. 5, air holes 24h are formed in side wall 24.

One air hole 24h is formed in each side wall 24 of case 21 as shown in FIG. 5, for example. It should be noted that the number and size of air holes 24h are not limited as long as case 21 is configured such that flow of air is produced therein. For example, an air hole 24h may be formed in any one of side walls 24 of case 21.

It should be noted that at least two air holes are preferably provided in the whole of case 21 because there are entrance and exit for air. However, even when one air hole is provided in the whole of case 21, the inside of case 21 can be avoided from being a sealed space, thereby maintaining a balance between pressure in the case and pressure of the external air. Moreover, minimum air permeability can be secured by making a contrivance with regard to an opening area or shape of the air hole.

Figure 6:
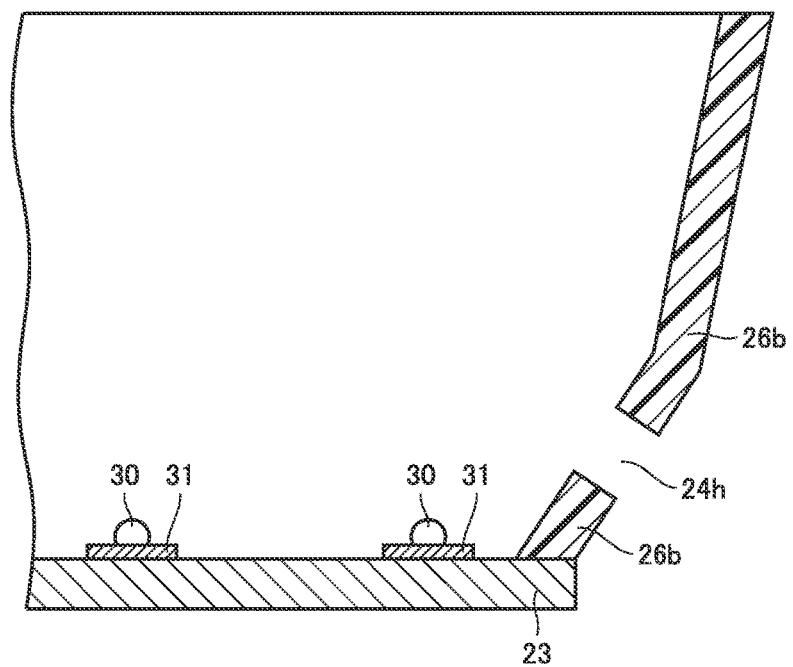
FIG. 6 is a cross sectional view along a VI-VI cross section in FIG. 5.

FIG. 6 is a cross sectional view along a VI-VI cross section in FIG. 5.

Each of air holes 24h formed in side wall 24 is inclined from the inner surface side of side wall 24 to the outer surface side of side wall 24 downward, i.e., in a direction from the upper end of side wall 24 toward the lower end of side wall 24. It should be noted that the angle of inclination of air hole 24h is not particularly limited. Air hole 24h may be formed to extend straightly downward, for example.

Preferably, as shown in FIG. 6, air hole 24h may be formed in sub-side plate 26b of side wall 24. Since sub-side plate 26b is inclined relative to the outer surface side at the angle larger than the angle of inclination of main side plate 26a, the inclination of air hole 24h can be increased more.

[Attachment of Photovoltaic Module to Frame Member]

Figure 7:
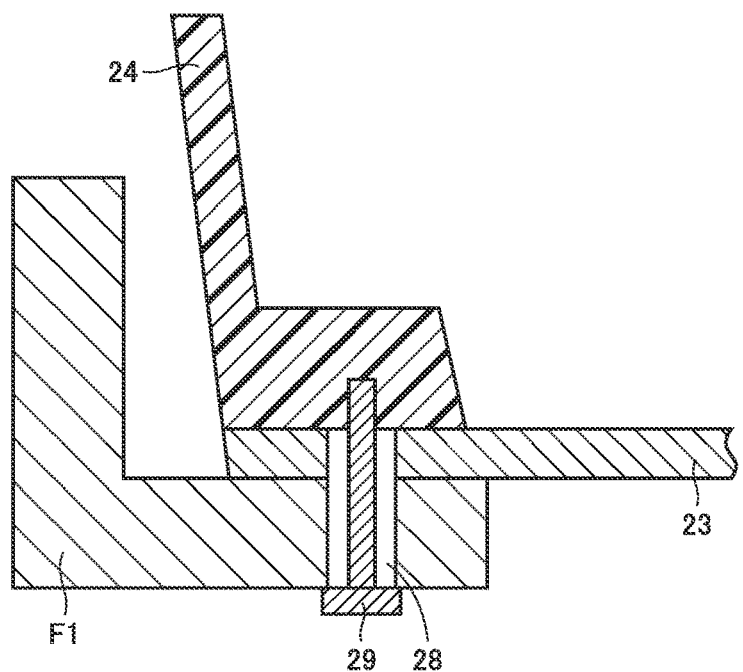
FIG. 7 is a cross sectional view along a VII-VII cross section in FIG. 5.

FIG. 7 is a cross sectional view along a VII-VII cross section in FIG. 5 in order to illustrate a state in which the case of the photovoltaic module according to the first embodiment is attached to the frame member.

As shown in FIG. 7, when case 21 of photovoltaic module 1 is inserted in accommodation portion E1 formed by frame member F1, bottom portion 23 of case 21 is brought into contact with the upper surface of frame member F1. In such a state, for example, a bolt 29 is inserted into an attaching hole 28 formed in bottom portion 23 and side wall 24, thereby fixing case 21 to frame member F1.

It should be noted that instead of the configuration in which case 21 is fixed to frame member F1 by inserting bolt 29 into attaching hole 28, case 21 may be fixed to frame member F1 in a different manner.

[Effect of Photovoltaic Module According to First Embodiment]

As described above, photovoltaic module 1 includes power generation element 30 configured to generate power when receiving light; and closed case 21 in which power generation element 30 is accommodated. Case 21 includes: light collecting portion 22 provided with the lens (Fresnel lens 22f) for collecting sunlight; bottom portion 23 on which power generation element 30 is disposed; and side wall 24 defining the outer frame of bottom portion 23 and supporting light collecting portion 22. Side wall 24 includes air hole 24h inclined downward from the inner surface side of side wall 24 toward the outer surface side of side wall 24.

Here, a photovoltaic device may be used at a location with a large range of temperature variation. A change in temperature may cause expansion or contraction of the bottom portion, thereby changing a distance between the power generation element provided at the bottom portion and the Fresnel lens provided at the upper surface of the case.

When the distance between the power generation element and the Fresnel lens is changed in this way, the distance does not coincide with a focal distance of the Fresnel lens, with the result that sunlight may be unable to be collected efficiently.

On the other hand, in photovoltaic module 1 according to the first embodiment, air hole 24h is formed in side wall 24. Hence, flow of air is produced in case 21, thereby suppressing a significant change in temperature in case 21. Accordingly, bottom portion 23 can be suppressed from being expanded and contracted.

Moreover, in the photovoltaic module according to the first embodiment, side wall 24 is composed of a resin. Therefore, even if the focal distance of the lens is changed in response to the change in temperature, the side wall is also expanded or contracted in response to the change in temperature, thereby changing the distance between the lens and the power generation element. As a result, even if the focal distance of the lens is changed, the amount of sunlight collected to the power generation element is prevented from being decreased significantly, whereby the power generation efficiency of the photovoltaic module can be suppressed from being decreased.

Thus, the decrease in power generation efficiency of the photovoltaic module can be suppressed by the configuration in which air hole 24h is provided in side wall 24 of case 21 and side wall 24 is composed of a resin.

Meanwhile, a photovoltaic device is used outdoors, i.e., in an environment involving foreign matters such as rain water and dusts. Entrance of the foreign matters such as rain water and dusts into the case may cause decreased performance of the photovoltaic device or the like.

To address this, in photovoltaic module 1 according to the first embodiment, air hole 24h is inclined downward from the inner surface side of side wall 24 toward the outer surface side of side wall 24, whereby the foreign matters such as rain water and dusts are unlikely to enter the inside of the case via air hole 24h.

Thus, according to the configuration in which air hole 24h is inclined downward from the inner surface side of side wall 24 toward the outer surface side of side wall 24, the rain water and dusts can be suppressed from entering the inside of the case, thereby suppressing decrease in performance of the photovoltaic module.

Second Embodiment

A photovoltaic module 1 according to a second embodiment further includes partition plates 24g inside an air hole 24h provided in a side wall 24. Here, the following mainly describes a difference from the above-described photovoltaic module 1 according to the first embodiment.

Figure 8:
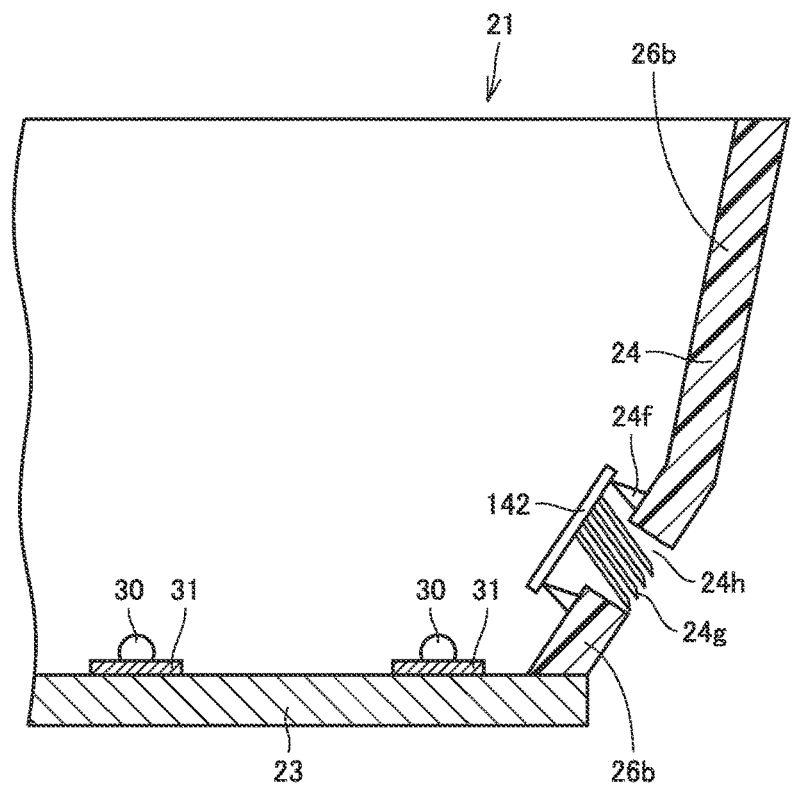
FIG. 8 is a cross sectional view showing a configuration of a case according to a second embodiment.
Figure 9:
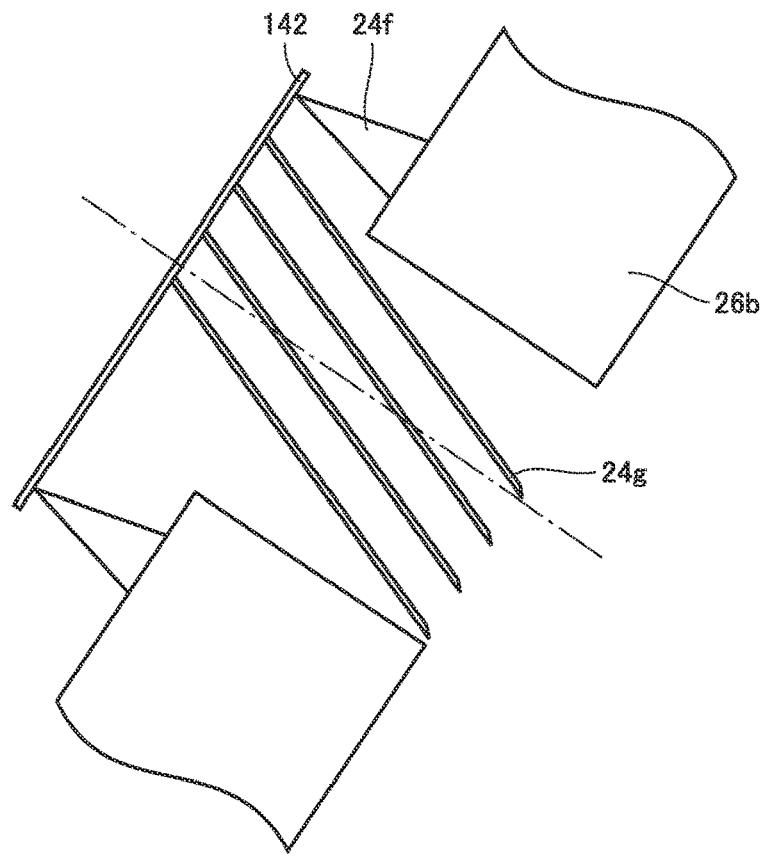
FIG. 9 is a cross sectional view showing a configuration of partition plates shown in FIG. 8 more in detail.
Figure 10:
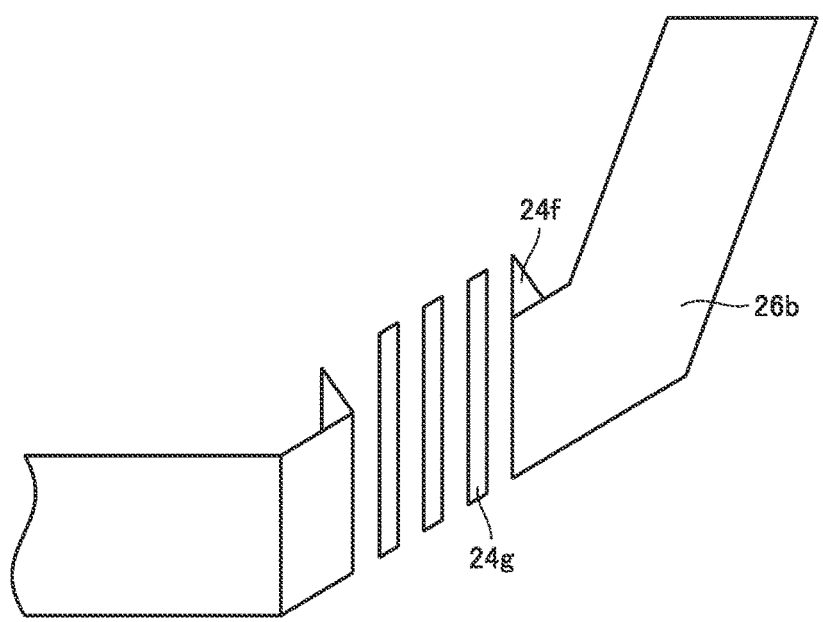
FIG. 10 is a cross sectional view showing a modification of the partition plates shown in FIG. 8.
Figure 11:
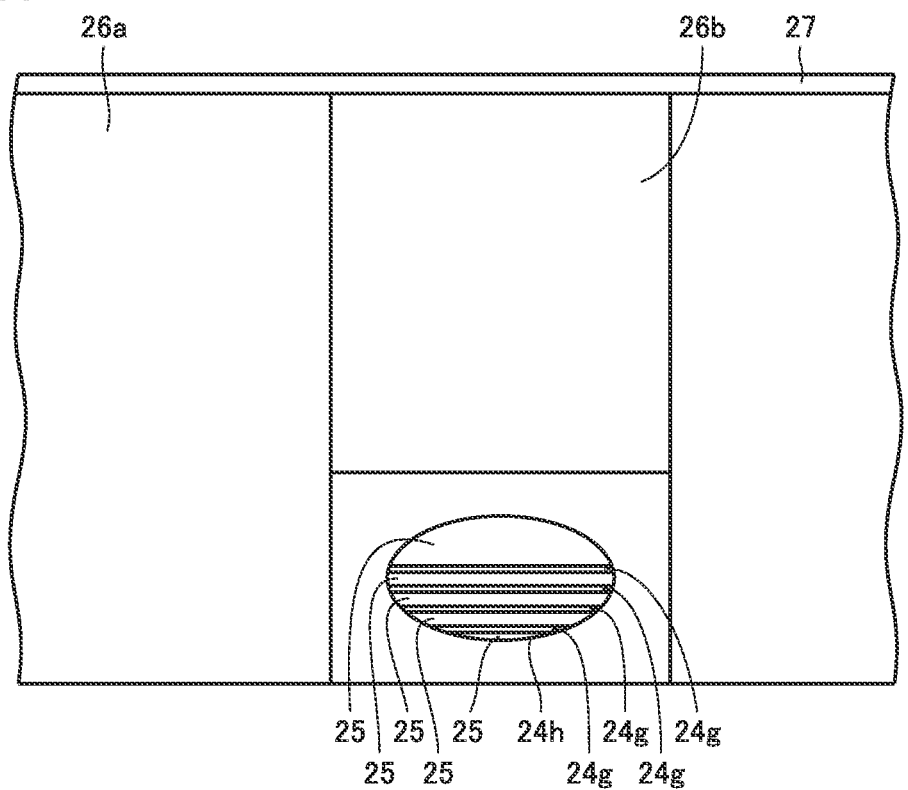
FIG. 11 is a front view of an air hole and the partition plates shown in FIG. 8 when viewed from outside.

FIG. 8 is a cross sectional view showing a configuration of a case according to the second embodiment. FIG. 9 is a cross sectional view showing a configuration of the partition plates shown in FIG. 8 more in detail. FIG. 10 is a cross sectional view showing a modification of the partition plates shown in FIG. 8. FIG. 11 is a front view of the air hole and partition plates shown in FIG. 8 when viewed from outside.

As shown in FIG. 8, in comparison with case 21 according to the first embodiment, side wall 24 of photovoltaic module 1 according to the second embodiment includes partition plates 24g. Preferably, side wall 24 further includes a projecting ring 24f and a filter 142.

[Configuration of Partition Plate]

As shown in FIG. 9, partition plates 24g are formed inside air hole 24h.

Preferably, as shown in FIG. 11, partition plates 24g may be formed to cross the inner surface of side wall 24. In other words, partition plates 24g may be formed to divide air hole 24h into a plurality of sub-air holes 25. By forming partition plates 24g in this way, side wall 24 can be reinforced.

Preferably, as shown in FIG. 9, the end portion of each of partition plates 24g at the inner surface side of side wall 24 may be formed to project relative to the inner surface of side wall 24.

Preferably, as shown in FIG. 9, the end portion of partition plate 24g at the outer surface side of side wall 24 may be formed to be acute. By forming partition plate 24g in this way, even if water flows on partition plate 24g, the water is facilitated to fall downward, whereby the water can be further suppressed from entering the inside of the case.

Preferably, as shown in FIG. 10, partition plate 24g may be formed to extend in a direction from the upper end of side wall 24 toward the lower end of side wall 24. By forming partition plate 24g in this way, the direction in which partition plate 24g is formed coincides with a direction in which natural convection is produced, thereby causing a straightening action with which air can efficiently flow upward and downward within the case. Accordingly, excessive temperature increase in the case can be suppressed further.

Preferably, as shown in FIG. 11, partition plates 24g are formed such that the whole of air hole 24h is covered with partition plates 24g when case 21 is viewed in a side view. According to such a configuration of partition plates 24g, water can be further suppressed from entering the inside of the case even when slanting rain is falling, for example.

[Configurations of Projecting Ring and Filter]

As shown in FIG. 9, projecting ring 24f is formed to surround the outer circumference of air hole 24h at the inner surface side of side wall 24. According to the configuration of such a projecting ring 24f, air passing through air hole 24h can be guided, thereby further suppressing excessive temperature increase in the case.

As shown in FIG. 9, filter 142 is provided on the end portion of each of projecting ring 24f and partition plate 24g at the inner surface side of side wall 24 to cover air hole 24h.

Filter 142 is preferably a mesh-like member molded using tetrafluoroethylene resin (PTFE).

Filter 142 is melted to be joined to the end portion of each of projecting ring 24f and partition plate 24g at the inner surface side of side wall 24. According to the configuration in which filter 142 is provided, foreign matters, such as rain water, water droplets, or insects, can be further suppressed from entering.

Moreover, preferably, in the configuration shown in FIG. 9, side wall 24 may have a black color by mixing a black pigment, such as carbon black, with the resin for forming side wall 24. Filter 142 is a white mesh-like member molded using tetrafluoroethylene resin (PTFE) or the like. Hence, when filter 142 is melted to be joined to projecting ring 24f and partition plates 24g, the melted black resin of projecting ring 24f and partition plate 24g enters a space in filter 142, thereby forming a black-and-white stripe pattern on filter 142. Such a black-and-white stripe pattern has an insect repellent effect. Hence, according to such a configuration of filter 142, side wall 24, projecting ring 24f, and partition plate 24g, insects can be further suppressed from entering the inside of the case.

[Effect of Photovoltaic Module According to Second Embodiment]

Since partition plates 24g are formed inside air hole 24h in photovoltaic module 1 according to the second embodiment, the width of the opening of air hole 24h is substantially narrower than that in the case where such partition plates 24g are not provided. Hence, foreign matters, such as rain water and dusts, are unlikely to enter the inside of the case via air hole 24h, thereby further suppressing the performance of the photovoltaic module from being decreased due to entrance of rain water or dusts into the inside of the case.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

1: photovoltaic module; 2: platform; 12: panel case; 21: case; 22: light collecting portion; 22f: Fresnel lens (lens); 23: bottom portion; 24: side wall; 24f: projecting ring; 24g: partition plate; 24h: air hole; 25: sub-air hole; 26a: main side plate; 26b: sub-side plate; 28: attaching hole; 29: bolt; 30: power generation element; 31: FPC; 100: photovoltaic device; 142: filter; C1: solar azimuth indicator; E1: accommodation portion; F1: frame member; M1: driver.

The invention claimed is:

1. An enclosure for a concentrator photovoltaic device, the enclosure comprising a side wall having an upper end, a lower end, an inner surface and an outer surface, and a bottom portion provided at the lower end, the side wall being composed of a resin, the bottom portion being composed of metal,
  the side wall being provided with an air hole extending through the inner and outer surfaces of the side wall,
  the air hole being inclined from the inner surface of the side wall to the outer surface of the side wall in a direction from the upper end of the side wall toward the lower end of the side wall,
  wherein the side wall has a partition plate inside the air hole between the inner and outer surfaces of the side wall, and wherein the partition plate projects from the inner surface of the side wall.

2. The enclosure for the concentrator photovoltaic device according to claim 1, wherein the side wall is inclined so as for the width of the enclosure to increase toward the upper end from the lower end.

3. The enclosure for the concentrator photovoltaic device according to claim 1, the enclosure comprising a projecting ring formed to surround an outer circumference of the air hole at the inner surface of the side wall.

4. The enclosure for the concentrator photovoltaic device according to claim 1, wherein the partition plate is formed to extend in the direction from the upper end of the side wall toward the lower end of the side wall.

5. The enclosure for the concentrator photovoltaic device according to claim 1, wherein the side wall has a main side plate and a sub-side plate, the main side plate is formed to be inclined at a first angle relative to a line which is perpendicular to the bottom portion and passes through the lower end, and the sub-side plate is formed to be inclined relative to the line at a second angle larger than the first angle.

6. The enclosure for the concentrator photovoltaic device according to claim 5, wherein the air hole is formed in the sub-side plate.

7. The enclosure for the concentrator photovoltaic device according to claim 1, wherein the partition plate is formed to divide the air hole into at least two sub-air holes.

8. The enclosure for the concentrator photovoltaic device according to claim 1, wherein the partition plate is formed such that a whole of the air hole is covered with the partition plate when the enclosure for the concentrator photovoltaic device is viewed in a side view.

9. The enclosure for the concentrator photovoltaic device according to claim 1, wherein the partition plate includes an end portion at the outer surface side of the side wall and an end portion at the inner surface side of the side wall, and the end portion at the outer surface side of the side wall is formed to be acute.

10. A concentrator photovoltaic device comprising the enclosure for the concentrator photovoltaic device as recited in claim 1.

* * * * *